(12) United States Patent
Miller

(10) Patent No.: US 7,581,916 B2
(45) Date of Patent: Sep. 1, 2009

(54) SAMPLE INTRODUCTION AND TRANSFER SYSTEM AND METHOD

(75) Inventor: Mark C. Miller, Independence, MN (US)

(73) Assignee: ULVAC-PHI, Inc., Chigasaki-shi, Kanagawa-ken (JP)

( * ) Notice: Subject to any disclaimer, the term of this patent is extended or adjusted under 35 U.S.C. 154(b) by 203 days.

(21) Appl. No.: 11/487,299

(22) Filed: Jul. 14, 2006

(65) Prior Publication Data

US 2008/0014056 A1    Jan. 17, 2008

(51) Int. Cl.
*H01L 21/677*    (2006.01)

(52) U.S. Cl. ..................................... 414/217

(58) Field of Classification Search .................. 73/863, 73/864.81, 864.384, 864.91; 414/220.01, 414/217, 220, 222.01; 156/345.31, 345.32; 204/298.23, 298.25, 298.27
See application file for complete search history.

(56) References Cited

U.S. PATENT DOCUMENTS

| | | | | |
|---|---|---|---|---|
| 4,553,069 A * | 11/1985 | Purser | .................... | 315/111.81 |
| 4,605,469 A * | 8/1986 | Shih et al. | .................... | 117/108 |
| 4,746,256 A * | 5/1988 | Boyle et al. | .............. | 414/217.1 |
| 4,816,638 A * | 3/1989 | Ukai et al. | .............. | 219/121.43 |
| 4,861,563 A * | 8/1989 | Shekerjian et al. | ...... | 422/186.05 |
| 5,092,728 A * | 3/1992 | Crabb et al. | ................. | 414/217 |
| 5,135,635 A * | 8/1992 | Ikeda | ..................... | 204/298.25 |
| 5,183,547 A * | 2/1993 | Ikeda | ..................... | 204/298.25 |
| 5,292,393 A * | 3/1994 | Maydan et al. | ........ | 156/345.32 |
| 5,538,560 A * | 7/1996 | Zejda et al. | .................. | 118/730 |
| 5,730,801 A * | 3/1998 | Tepman et al. | .............. | 118/719 |
| 5,883,017 A * | 3/1999 | Tepman et al. | .............. | 438/800 |
| 5,902,088 A * | 5/1999 | Fairbairn et al. | ............ | 414/217 |
| 6,059,507 A * | 5/2000 | Adams | ........................ | 414/217 |
| 6,152,669 A * | 11/2000 | Morita et al. | ................ | 414/217 |
| 6,203,677 B1 * | 3/2001 | Konig | .................... | 204/298.27 |
| 6,710,354 B1 | 3/2004 | Koch et al. | | |
| 7,066,703 B2 * | 6/2006 | Johnson | ........................ | 414/217 |
| 2004/0037676 A1 * | 2/2004 | Harris et al. | ................. | 414/217 |
| 2005/0205209 A1 * | 9/2005 | Mosden | .................. | 156/345.31 |
| 2005/0254049 A1 | 11/2005 | Zhao et al. | | |
| 2007/0051312 A1 * | 3/2007 | Sneh | ........................... | 118/719 |
| 2007/0081880 A1 * | 4/2007 | Riordon et al. | .............. | 414/217 |
| 2008/0202686 A1 * | 8/2008 | Smith et al. | ............ | 156/345.32 |
| 2008/0202687 A1 * | 8/2008 | Smith et al. | ............ | 156/345.32 |

* cited by examiner

*Primary Examiner*—John Fitzgerald
(74) *Attorney, Agent, or Firm*—Mueting, Raasch & Gebhardt, P.A.

(57) ABSTRACT

A method and system that provides a processing chamber associated with a load lock chamber. A sample receiving stage coupled to a sample positioning apparatus is configured to move between an introduction position and a processing analysis position within the process chamber. The sample receiving stage is used to result in a sealed barrier between the process chamber and the associated load lock chamber when in the introduction position.

26 Claims, 11 Drawing Sheets

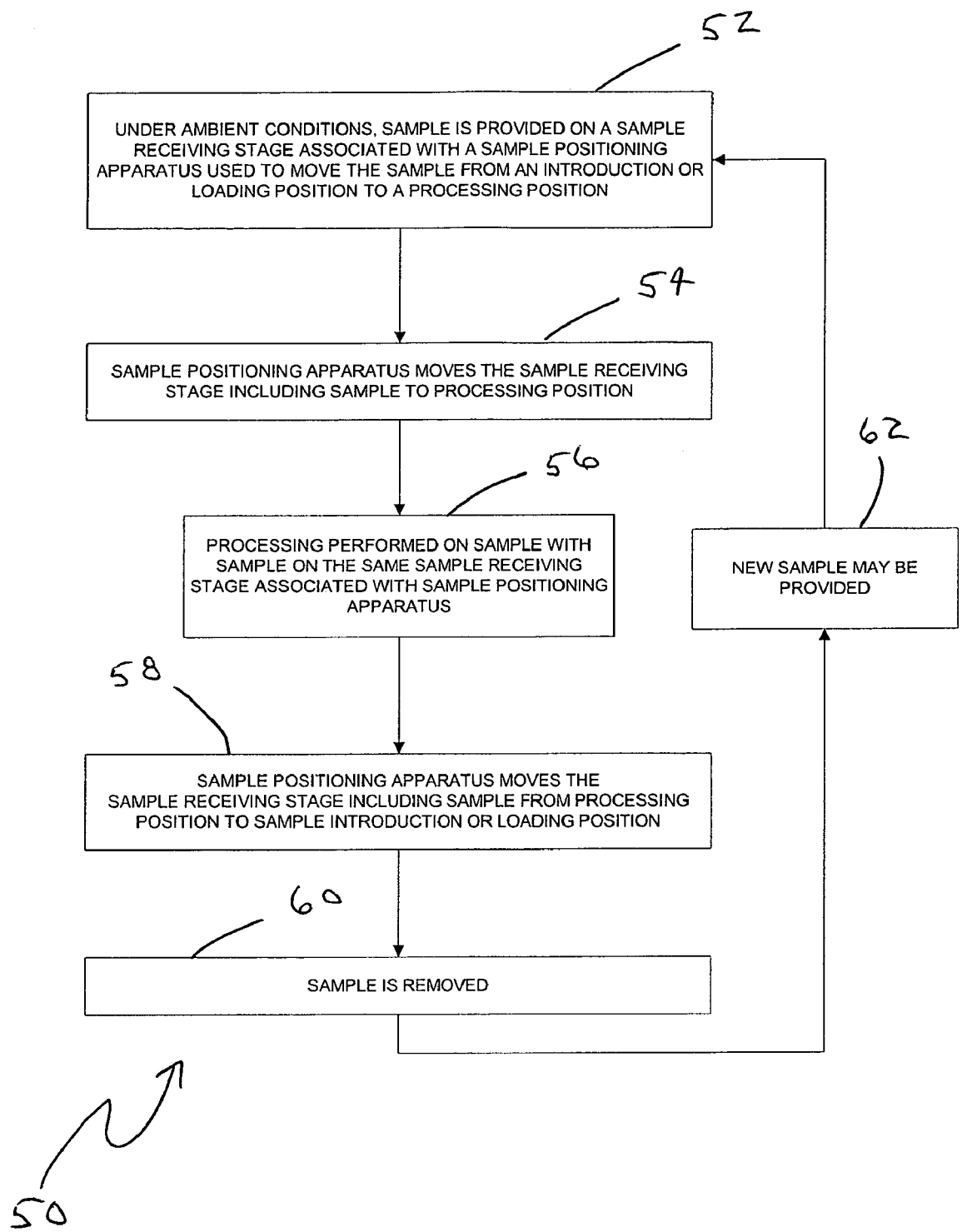

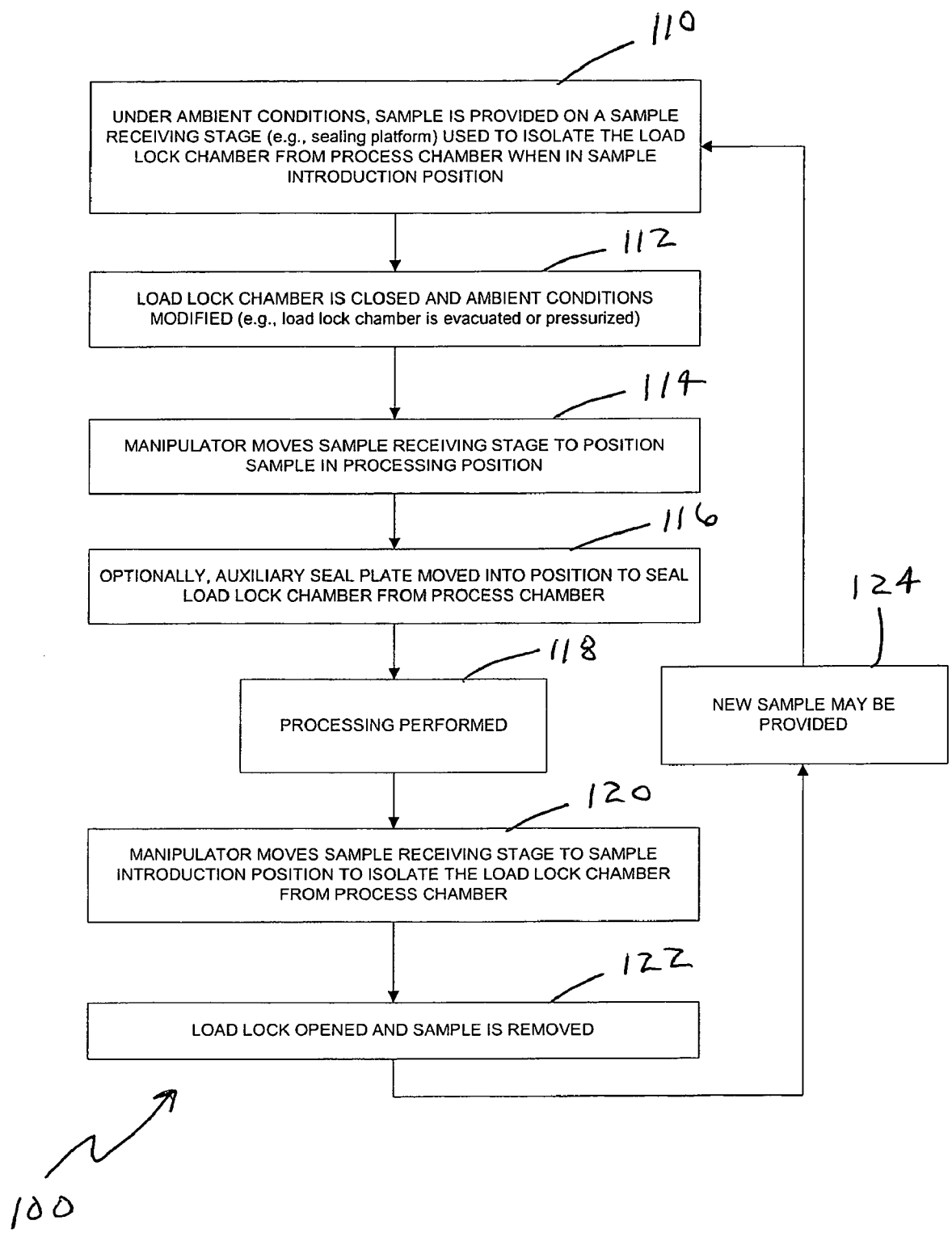

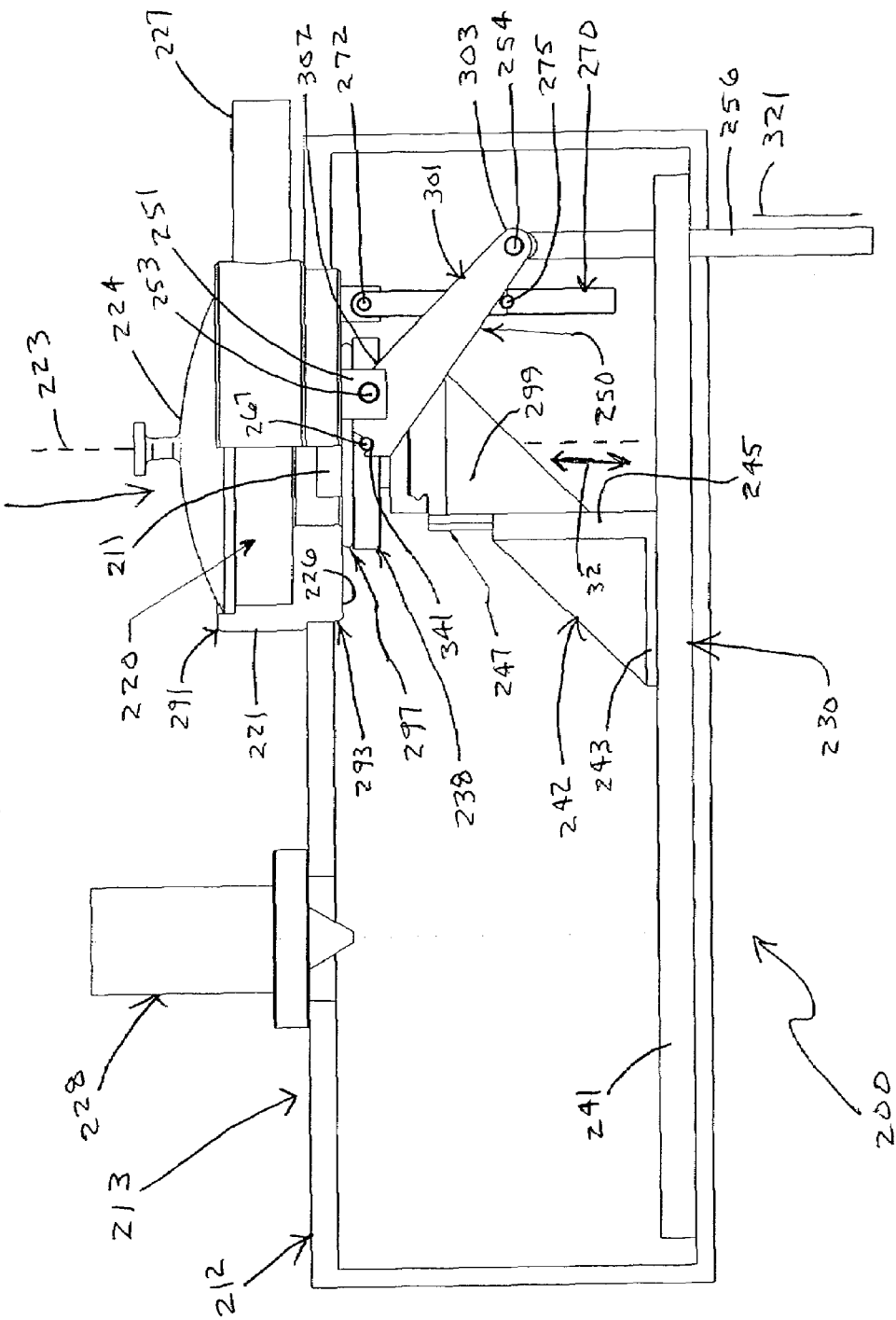

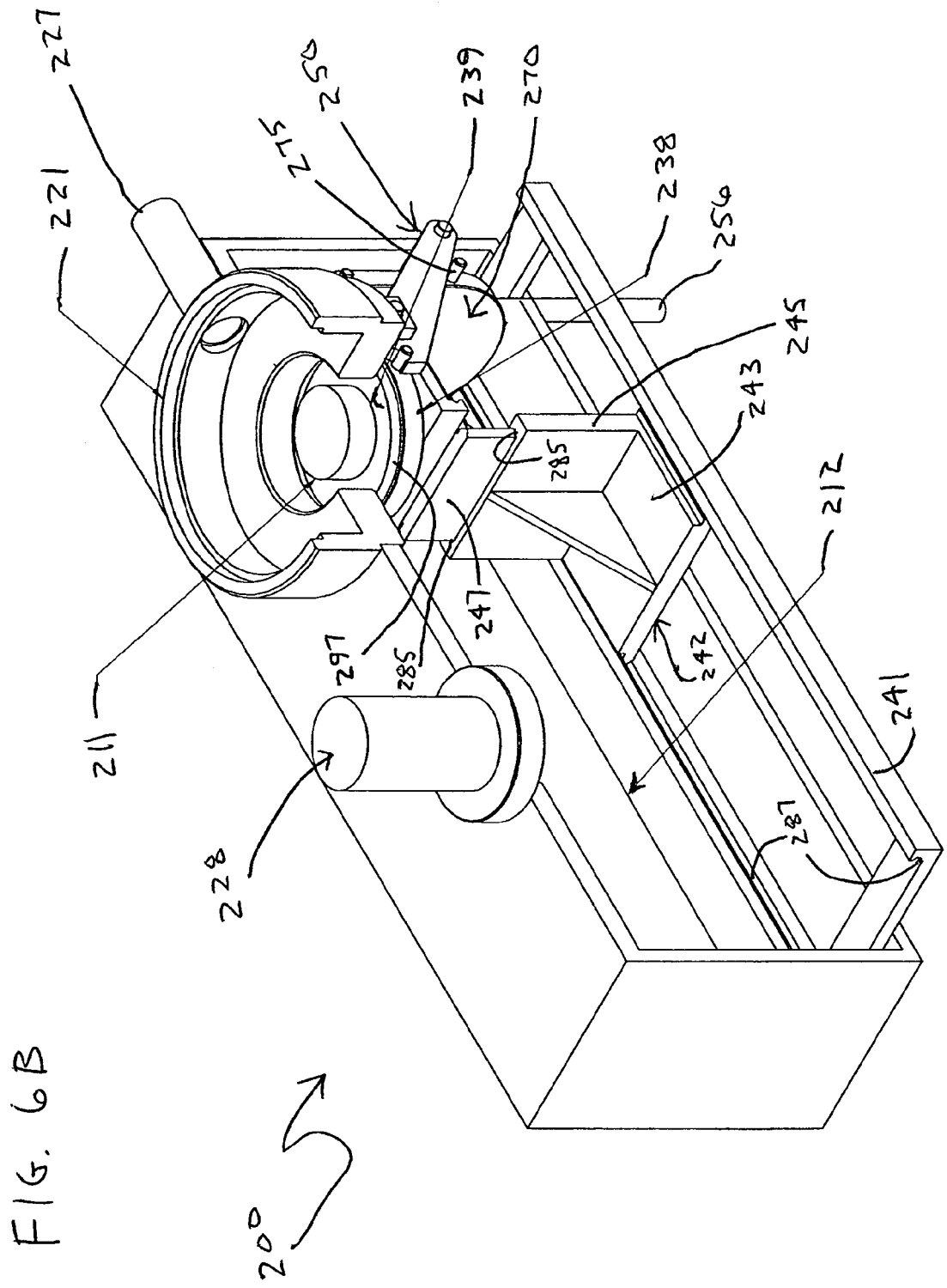

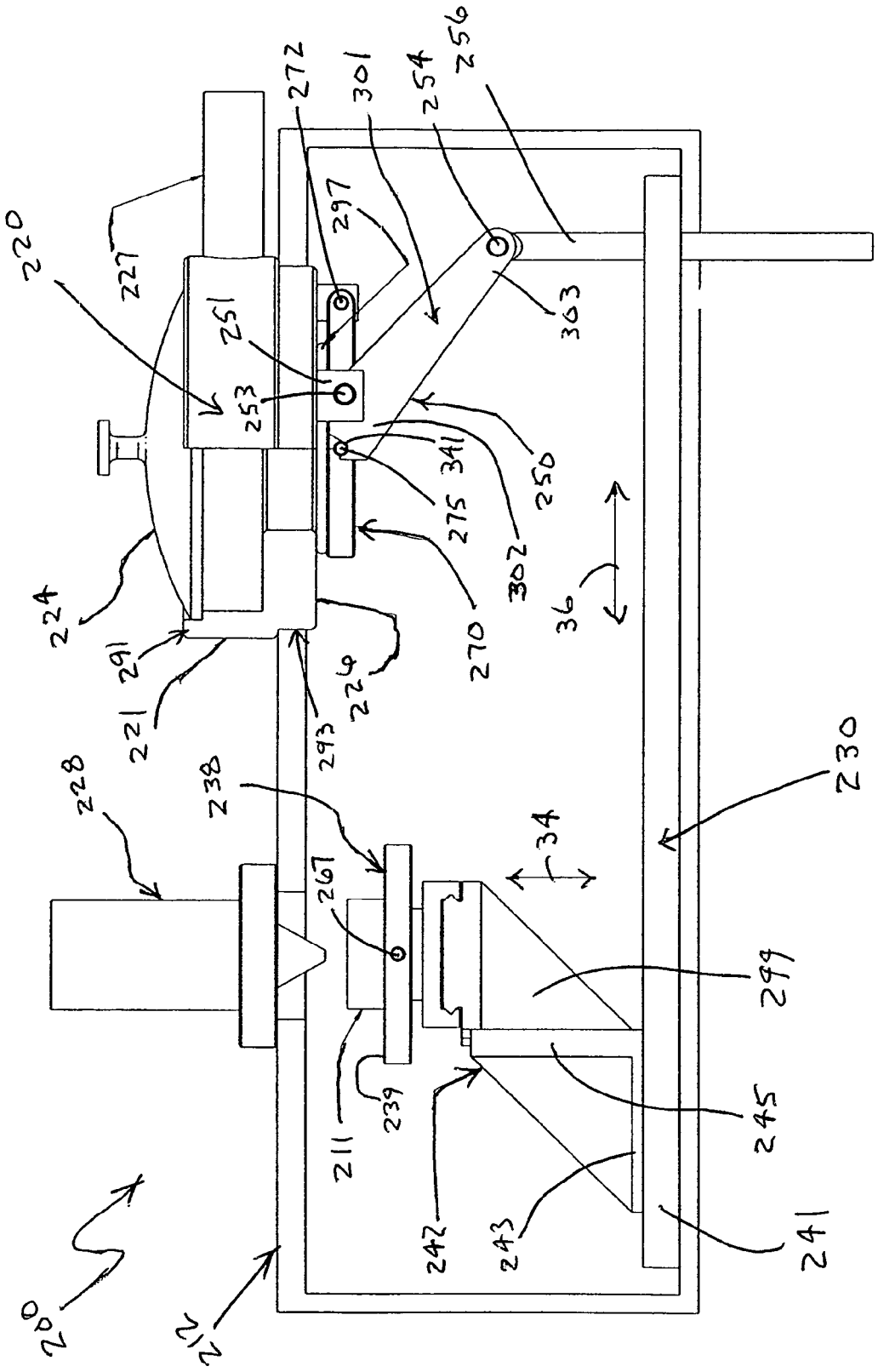

SAMPLE INTRODUCTION AND TRANSFER SYSTEM AND METHOD

BACKGROUND OF THE INVENTION

The present invention relates generally to material handling systems and methods. More particularly, the present invention pertains to sample handling methods and systems, such as, for example, those associated with processing systems (e.g., analysis systems such as systems designed to make surface measurements of samples, systems for performing deposition processes, etc.).

Various loading systems are available for providing a sample into a process chamber (e.g., a process chamber held at below or above atmospheric pressure), such that the sample introduced into the process chamber can be analyzed by an instrument, any other process can be carried out with respect to the sample using one or more other process tools. For example, such analysis instruments may include scanning electron microscopes (SEMs), instruments for performing elipsometry, instruments for performing transmission electron microscopy (TEM), instruments for performing scanning transmission electron microscopy (STEM), instruments for performing secondary ion mass spectrometry (SIMS), instruments for performing x-ray photoelectron spectrometry (XPS, also known as electron spectroscopy for chemical analysis (ESCA)), instruments for performing auger electron spectrometry (AES), or any other instruments for use in measuring of one or more properties of a sample (e.g., instruments using electron beams, etc.). Further, for example, other process tools may include etching tools, deposition tools (e.g., atomic layer deposition (ALD) tools, chemical vapor deposition tools, etc.), implant tools (e.g., ion implantation tools), etc.

A conventional loading system and method are shown generally in FIGS. 1 and 2A-2C. For example, as shown in FIGS. 2A-2C, a conventional loading system 430 includes a transfer apparatus 442 that is employed to load a sample 431 (e.g., a transferable work piece) into a process chamber 432 so that measurements may be taken when the process chamber 432 is held at below or above atmospheric pressure (e.g., a high vacuum (HV) or a ultra-high vacuum (UHV) environment), or is held at any other conditions different than ambient conditions.

The process chamber 432 is generally associated with a work piece manipulator 452 and is generally configured for modification of the pressure therein (e.g., with use of a pump, not shown). The process chamber 432 is generally separated from the loading system 430 by a load lock isolation valve 434.

The loading system 430 includes a load lock chamber 436 for receiving a work piece 431 and configured in a manner such that the pressure within the load lock chamber 436 may be made equal to that of the process chamber 432 prior to transfer of the work piece 431 into the process chamber 432. The load lock chamber 436 generally includes a load lock cover 438 which can be removed such that a sample 431 (e.g., transferable work piece) may be positioned therein. Further, the load lock chamber 436 includes a load lock pumping port 440 for use in bringing the load lock chamber to a pressure above or below atmospheric pressure.

The transfer apparatus 442 of the loading system generally includes a transfer probe 444 having at least a portion thereof (e.g., transfer holding device 445) which is positioned in the load lock chamber 436 for receiving or holding the sample 431 therein. In addition, the transfer apparatus 442 includes a transfer probe actuator 446 for moving the transfer probe 444 such that the sample 431 can be repositioned from the load lock chamber 431 to within the process chamber 432 (e.g., positioned on work piece receiver element 451 of work place manipulator 452).

The conventional loading system 430 shown in FIGS. 2A-2C may be used in the conventional transfer and process method 400, as shown and described with reference to FIG. 1. The transfer and process method 400, shown in FIG. 1, generally may be initiated by providing a sample 431 on the transfer holding device 445 associated with transfer probe 444 in load lock chamber 436 under ambient conditions (block 402). For example, load lock cover 438 may be removed and a sample provided that is to be held by transfer holding device 445.

With the sample 431 positioned in the load lock chamber 436, the load lock chamber 436 may be sealed and evacuated (block 404). With the pressure in the load lock chamber 436 equal to the pressure in the process chamber 432, the isolation valve 434 between the load lock chamber 436 and the process chamber 432 is opened (block 406). The transfer holding device 445 associated with transfer probe 444 is advanced to the processing position (e.g., analysis position) within the process chamber 432 (e.g., using transfer probe actuator 446) (block 408). The sample 431 is then transferred to the work piece receiver element 451 of the manipulator 452 associated with the process chamber 432 (block 410). For example, the manipulator 452 may be moved such that work piece receiver 451 is positioned for receiving sample 431 thereon. Following transfer of the sample 431 to the manipulator 452, the transfer holding device 445 is retracted using transfer probe 444, and the isolation valve 434 is closed between the load lock chamber 436 and the process chamber 432 (block 412). In such a manner, the pressure in the process chamber 432 is substantially maintained.

With the sample 431 in the process chamber 432, processing (e.g., analysis) may be performed thereon (block 414). For example, one or more surface measurements may be taken using one or more different types of analysis instruments associated with the process chamber 432. For example, XPS analysis may be performed in high vacuum or ultra-high vacuum environments of the process chamber 432 by a suitable instrument configured for use in analysis of a sample 431 within process chamber 432.

After completion of processing (e.g., analysis) (block 414), with the load lock chamber 436 evacuated to be at the same pressure as the process chamber 432, the isolation valve 434 is opened (block 416). The transfer holding device 445 is advanced using transfer probe 444 and transfer probe actuator 446 to the processing (e.g., analysis) position within the process chamber 432 (block 418) so as to receive (e.g., grasp) or otherwise become associated with sample 431 (block 420). With the sample transferred from the manipulator receiver element 451 in the process chamber 432 to the transfer holding device 445, the transfer holding device 445 is retracted back into the load lock chamber 436 using the transfer apparatus 442, and the isolation valve 434 is closed between the load lock chamber 436 and the process chamber 432 (block 422). As the process chamber 432 is isolated from the load lock chamber 436, the load lock chamber 436 may be brought to atmospheric pressure (e.g., pressurized), opened, and the sample 431 may be removed (block 424). A new sample may then be provided into load lock chamber 436 and the process repeated (block 426).

Such a conventional loading system 430 includes many components to accomplish the transfer into the process chamber 432 without loss of pressurization within the process chamber 432. For example, a separate transfer apparatus and isolation valve are required components of the loading system and add significant cost to such a system. Further, with use of such a conventional delivery or loading mechanism utilizing an isolation valve, significant pumping time is required to bring the load lock chamber 436 and its associated components to a suitable state above or below atmospheric pressure in order to equal that of the process chamber 432. Such a large pumping time decreases the speed of sample introduction.

The work piece manipulator 452 in such conventional systems generally needs to be converted for receipt of various different types of samples that are introduced therein. As such, the process chamber 432 needs to be opened thereby exposing it to atmosphere and requiring recovery procedures when different types of samples are to be introduced. In addition, any auxiliary functions, such as sample heating and cooling that are required in both the load lock chamber and the process chamber (e.g., at the introduction and analysis positions), require separate hardware to perform such functions. For example, hardware for heating or cooling the sample must be provided in both the load lock chamber and the process chamber.

Yet further, conventional loading systems have one or more of the following shortcomings. Load lock volume is large requiring a longer time to achieve pressure equalization. For example, as described above, the transfer mechanism adds to load lock volume and has a mechanism which interferes with pressure equalization. Further, use of a transfer probe must be accurately positioned in the process chamber to permit reliable transfer, and the work piece manipulator must be accurately positioned with respect to the work piece or sample on the transfer probe to permit reliable transfer. In other words, overall, loading reliability is undesirably low.

Further, other shortcomings of such conventional transfer systems are apparent. For example, a remote clamping mechanism must be provided on the manipulator to hold the sample securely within the process chamber. Clamping mechanisms have low rigidity to prevent sample vibration and low transfer position repeatability. Yet further, conventional systems are fairly large in size due to the number of components and type of components used therein. Overall system vibration is much greater because of the use of the transfer probe and such other additional components necessary for carrying out the functionality of such a conventional loading system.

SUMMARY OF THE INVENTION

One or more of the embodiments according to the present invention provide one or more advantages over conventional systems and methods. For example, one or more embodiments of the present invention provide for greater simplicity and reduced cost. For example, in accordance with the present invention, the sample manipulator functions to both transfer and position samples for processing (e.g., analysis). This makes the manipulator dual purpose, as opposed to other conventional sample manipulators currently used for processing equipment (e.g., analysis equipment) which require a separate transfer device from the introduction load lock. The present invention does not require a separate transfer device and isolation valve. As such, with the reduction of the number of components, cost is also reduced.

One or more embodiments of the present invention also speed up sample introduction. For example, the volume of the high pressure zone in the load lock is reduced due to the elimination of a separate delivery mechanism and isolation valve, thus reducing pumping time.

Convenience and versatility are also provided by one or more embodiments of the present invention. For example, the present invention provides for greater reliability than conventional loading systems by providing an automated introduction function. Further, conversion of the manipulator (e.g., sample positioning apparatus and associated receiving stage) in one or more embodiments of the present invention for different styles of samples can be accomplished without the time intensive requirement to open the main process chamber. As such, there is no exposure to atmosphere and no recovery procedures are required. Yet further, one or more embodiments of the present invention provide versatility in that for auxiliary functions, such as sample heating and cooling that are to be performed at both introduction and processing (e.g., analysis) positions, common hardware can be employed.

A method for processing a sample according to one embodiment of the present invention includes providing a process chamber associated with a load lock chamber and providing a sample receiving stage coupled to a sample positioning apparatus. The sample positioning apparatus is configured to move the sample receiving stage between an introduction position and a processing position within the process chamber. The sample receiving stage is moved using the sample positioning apparatus to the introduction position resulting in a sealed barrier between the process chamber and the associated load lock chamber. The method further includes positioning a sample on the sample receiving stage, moving the sample receiving stage using the sample positioning apparatus to the processing position, and processing the sample positioned on the sample receiving stage.

In one embodiment of the method, moving the sample receiving stage using the sample positioning apparatus to the introduction position may include moving the sample receiving stage using the sample positioning apparatus from the processing position to the introduction position after processing the sample resulting in a sealed barrier between the process chamber and the associated load lock chamber. The load lock chamber may then be returned to ambient conditions (e.g., atmospheric pressure), the load lock chamber opened, and the sample removed from the sample receiving stage to allow for another sample to be positioned on the sample receiving stage.

In another embodiment of the method, positioning a sample on the sample receiving stage may include opening the load lock chamber to allow access thereto, providing the sample on the receiving stage, closing the load lock chamber, and modifying ambient conditions in the load lock chamber (e.g., pressurizing or evacuating the load lock chamber).

Further, in another embodiment of the method, moving the sample receiving stage using the sample positioning apparatus to the processing position may include moving the sample receiving stage at least along a first axis from a region of the process chamber proximate the load lock chamber to a region of the process chamber proximate at least one component of a processing system (e.g., an analysis system) associated with the process chamber. Yet further, the sample receiving stage may be moved at least along a second axis to force contact between the sample receiving stage and a sealing surface of the load lock chamber located in the process chamber.

Another method for processing a sample according to another embodiment of the present invention includes using a sample positioning apparatus to position a sample provided on a sample receiving stage for processing in a process chamber held at conditions different than ambient conditions. The method further includes providing a load lock chamber that includes a sealing surface with the sealing surface located within the process chamber and moving the sample receiving stage using the sample positioning apparatus into contact with the sealing surface of the load lock chamber permitting the load lock chamber to be returned to ambient conditions.

In one embodiment of the method, the method may include returning the load lock chamber to ambient conditions after the sample receiving stage is moved into contact with the sealing surface of the load lock chamber, opening the load lock chamber, and removing the sample from the sample receiving stage to allow for another sample to be positioned on the sample receiving stage.

In yet another embodiment of the method, the method may further include providing a sample on the receiving stage, closing the load lock chamber, and evacuating or pressurizing the load lock chamber.

In one or more embodiments of such methods for processing samples, an auxiliary seal mechanism may be used to provide a sealed barrier between the process chamber and the associated load lock chamber when the sample receiving stage is moved to the processing position and/or a transfer-type sample mounting system may be used to transfer one or more samples between the sample receiving stage and one or more auxiliary chambers.

A system for use in processing a sample according to one embodiment of the present invention is also described. The system includes a process chamber configured to be held at conditions different than ambient conditions, a load lock chamber that includes a sealing surface located within the process chamber, a sample receiving stage for receiving a sample, and a sample positioning apparatus associated with the sample receiving stage. The sample positioning apparatus is configured to move the sample receiving stage between an introduction position at which the sample receiving stage is in contact with the sealing surface of the load lock chamber providing a sealed barrier between the process chamber and the load lock chamber and a processing position in the process chamber at which processing of the sample is performed.

In one or more embodiments of the system, the load lock chamber may be associated with a port for pressurization or evacuation of the load lock chamber and/or the load lock chamber may include a removable sealed cover for access to an interior of the load lock chamber.

In another embodiment of the system, the sample positioning apparatus may include a manipulator mechanism configured to move the sample receiving stage along at least two axes. For example, the manipulator mechanism may be configured to move the sample receiving stage at least along a first axis from a region of the process chamber proximate the load lock chamber to a region of the process chamber proximate at least a portion of a processing system associated with the processing chamber used to process the sample. Yet further, for example, the manipulator mechanism may be configured to move the sample receiving stage at least along a second axis to force contact between the sample receiving stage and the sealing surface of the load lock chamber.

In yet another embodiment of the system, an auxiliary seal mechanism may be used to provide a sealed barrier between the process chamber and the associated load lock chamber when the sample receiving stage is moved to the processing position and/or a transfer-type sample mounting system may be used to transfer one or more samples between the sample receiving stage and one or more auxiliary chambers.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

BRIEF DESCRIPTION OF THE DRAWINGS

FIG. 4 shows a block diagram of one embodiment of a loading and processing method according to the present invention that may be implemented using an introduction and process system, such as shown generally in FIG. 3.

FIG. 5 shows one embodiment of a more detailed loading and processing method such as that shown more generally in FIG. 4.

FIG. 6A shows a detailed side view (i.e., with a chamber side removed) of one embodiment of an introduction and process system such as that shown generally in FIG. 3 with a sample to be processed (e.g., analyzed) in an introduction position (e.g., load lock position).

FIG. 6B is a cut-away and partial perspective view of the introduction and process system shown in FIG. 6A with the sample to be analyzed in an introduction position (e.g., load lock position).

FIG. 6D is yet another side view (i.e., with a chamber side removed) of the introduction and process system shown in FIG. 6A with the sample being located in a processing position and an auxiliary seal plate being used to seal the load lock chamber.

DETAILED DESCRIPTION OF THE EMBODIMENTS

Generally, an introduction and process system 10 and a loading and processing method 50 shall be described with reference to FIGS. 3 and 4. Various illustrative embodiments of such systems and methods shall then be further described in more detail with reference to FIGS. 5 and 6A-6D.

One skilled in the art will recognize from the description herein, that various illustrative embodiments described include some features or elements included in other illustrative embodiments and/or exclude other features or elements. However, an introduction and process system, or a loading and processing method, according to the present invention, may include any combination of features or elements selected from one or more of the various embodiments, as described herein with reference to FIGS. 3-6. For example, one or more embodiments may include an optional auxiliary seal plate for sealing the load lock chamber when the sample is provided in the processing position (e.g., analysis position). Further, for example, the sample positioning apparatus may include multiple degrees of freedom so as to position the sample in both the introduction positions and the processing positions. Yet further, for example, the process system may include analysis system components used to take measurements; such components may include any number of different components suitable for performing measurements on one or more various types of samples. Yet further, for example, the methods of loading a sample into the load lock chamber may vary and may actually be part of a larger system capable of transferring the sample to one or more auxiliary chambers. One skilled in the art will readily recognize that any number of various embodiments of the introduction and process systems and/or loading and processing methods may benefit from one or more of the features described herein.

Figure 1:
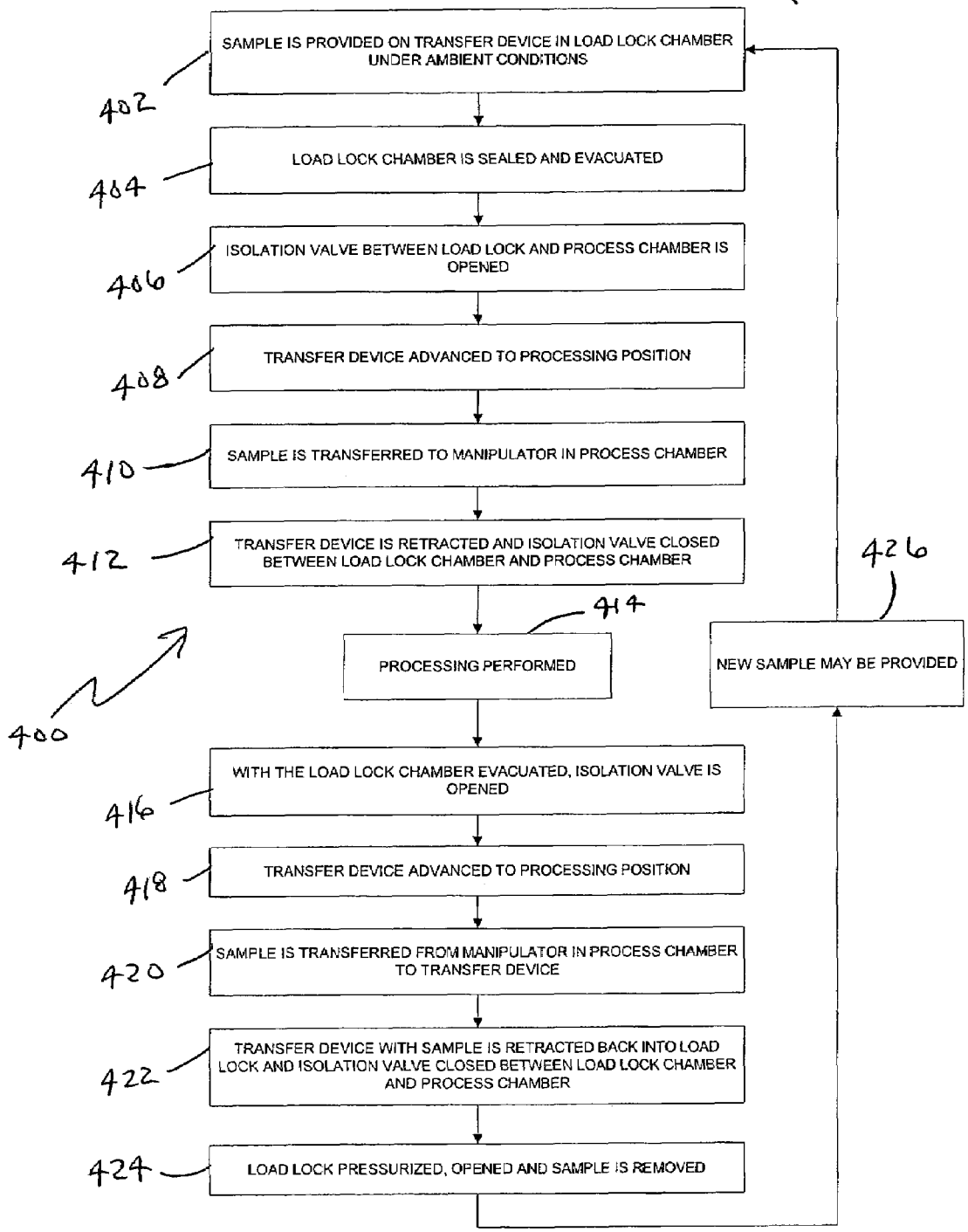
FIG. 1 shows one embodiment of an exemplary and conventional transfer and processing method.
Figure 2A:
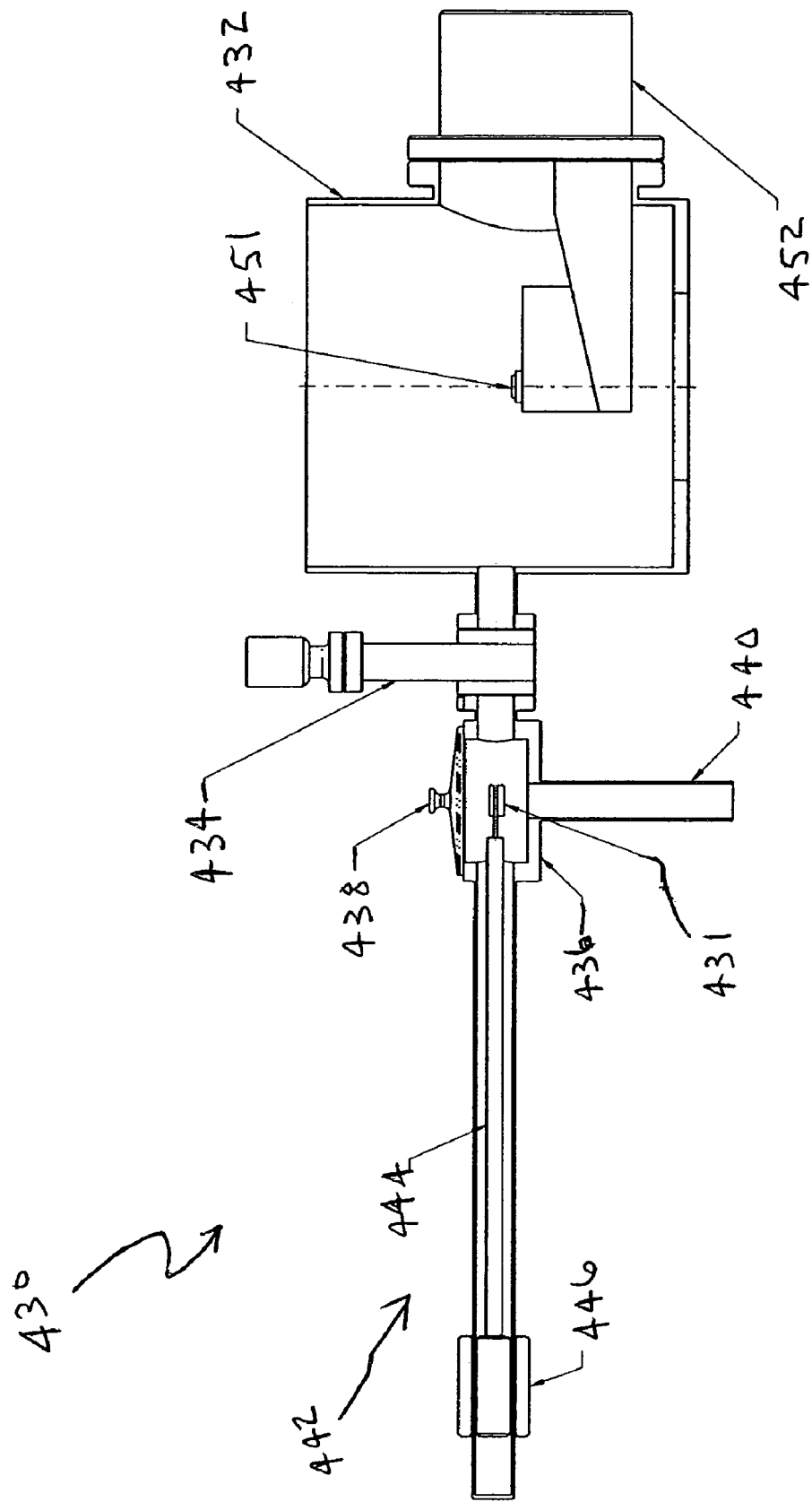
FIGS. 2A-2C show one embodiment of a conventional loading system and process chamber that may be employed to carry out the method as shown in FIG. 1 (i.e., at three different times during the method).
Figure 2B:
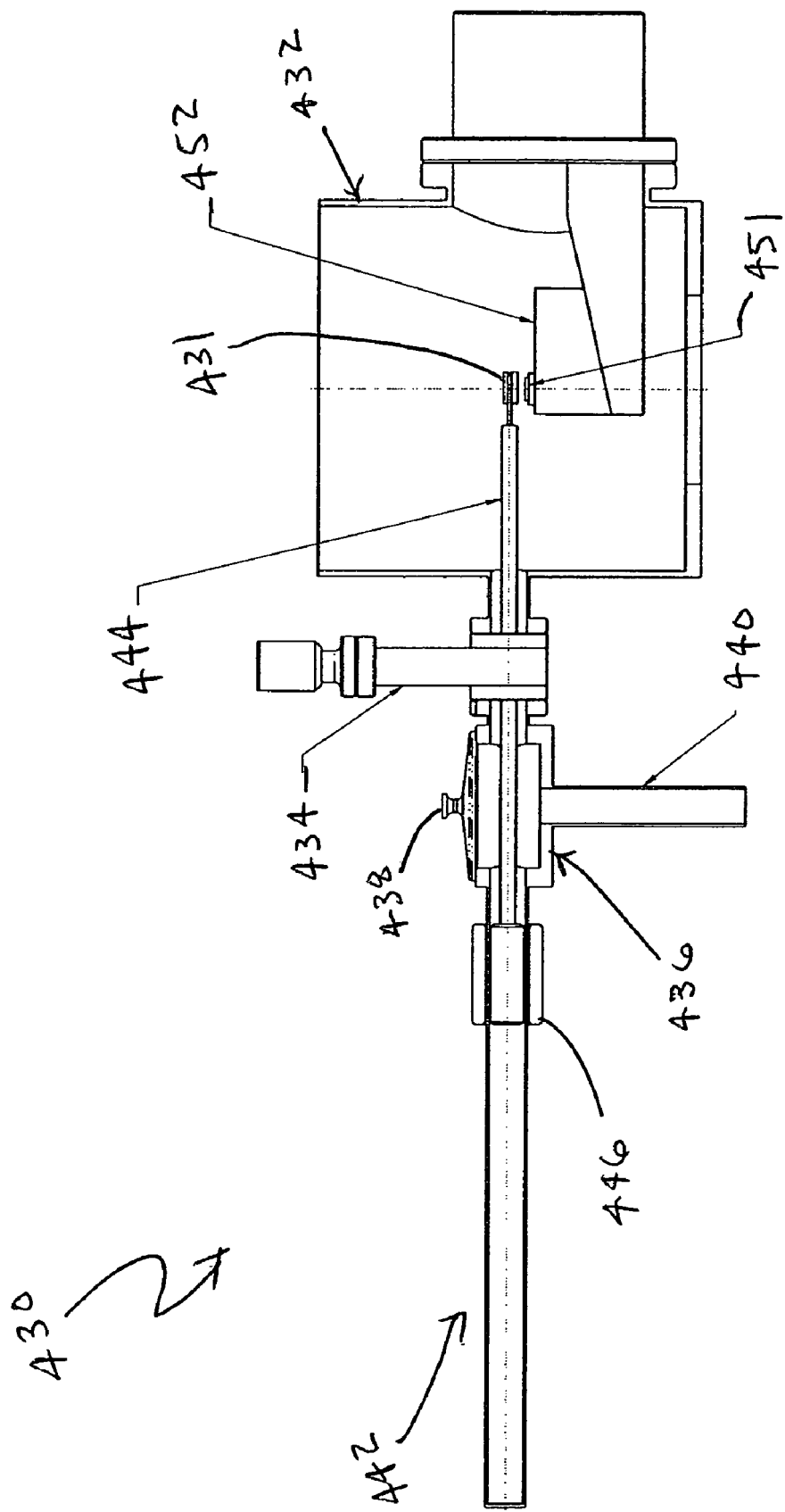
Figure 2C:
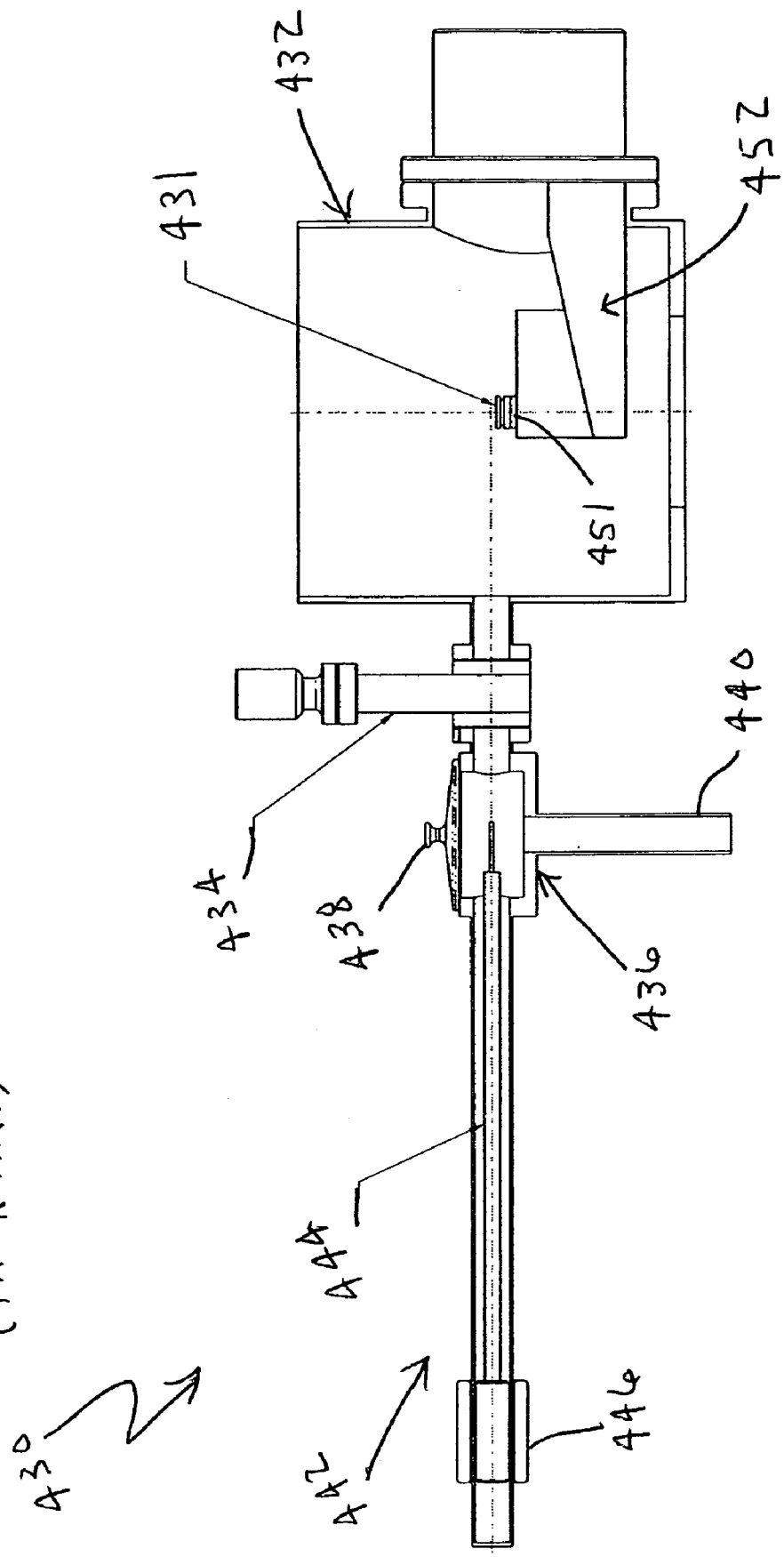
Figure 3:
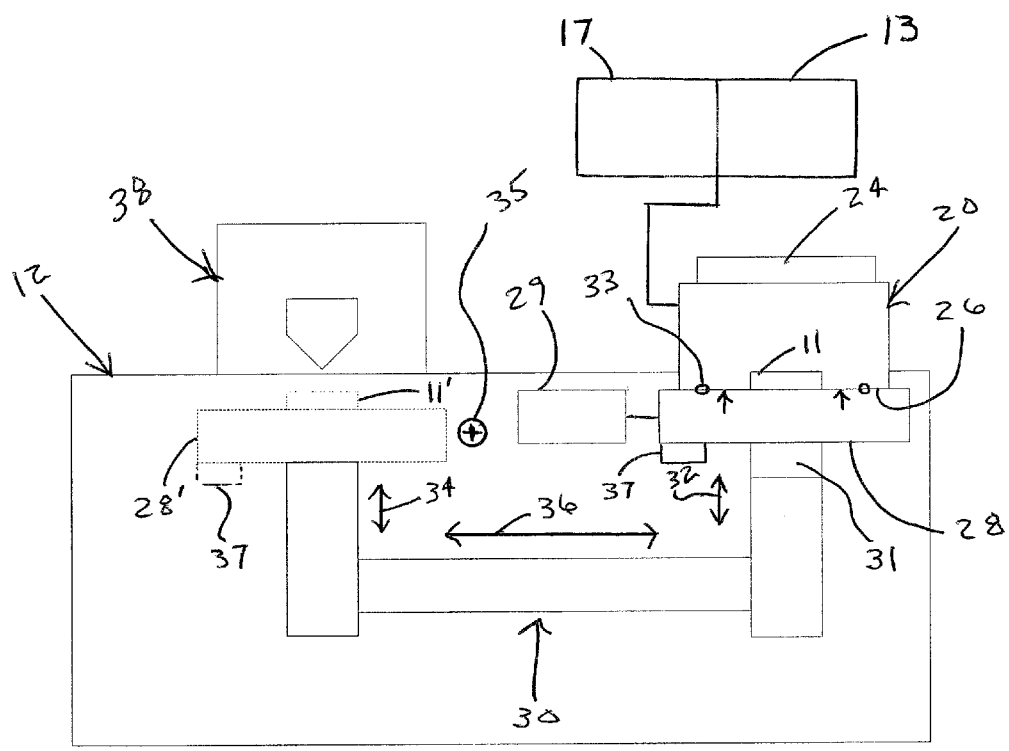
FIG. 3 shows a general diagrammatic view of an illustrative introduction and process system according to the present invention.

As shown in FIG. 3, generally, introduction and process system 10 includes a process chamber 12 configured to be held at one or more conditions different than ambient conditions (e.g., above or below atmospheric pressure), and a load lock chamber 20 configured such that the environment within the load lock chamber 20 may be equalized to that of the process chamber 12.

As used herein, ambient conditions refer to those conditions in an area outside of or surrounding the process chamber 12 (e.g., conditions of the environment in which the process chamber is located such as standard atmospheric pressure, conditions in the area outside the process chamber in which a user breathes, or any other conditions outside of the process chamber, such as in a transfer apparatus associated with the load lock chamber for transfer to another processing chamber). One or more conditions within the process chamber 12 that may differ from ambient conditions may include, for example, pressure, temperature, processing environment composition (e.g., nitrogen atmosphere), or any other condition as would be readily apparent to one skilled in the art depending on the processing carried out in the process chamber 12.

The introduction and process system 10 further includes a sample positioning apparatus 30 (e.g., a manipulator apparatus) associated with a sample receiving stage 28 for receiving a sample 11 (e.g., work piece) thereon. The sample positioning apparatus 30 is configured to move the sample receiving stage 28 associated therewith between an introduction position at which a sample 11 is received thereon and processing positions (e.g., an analysis position) in the process chamber 12 at which processing (e.g., analysis) of the sample 11 is performed using one or more process system components 38 (e.g., analysis system components).

As used herein, a sample refers to any object or portion thereof upon which processing may be performed. For example, samples may include integrated circuits, semiconductor wafers or portions thereof to be processed (e.g., analyzed), objects formed of materials to be modified, objects having surfaces to be modified, objects to be analyzed (e.g., concentration of materials or structure of such objects to be determined), etc. The present invention is not limited to any particular object or portion thereof, nor limited to an object of any particular size or configuration, but may be any object that can be subjected to processing or introduced into a process chamber in the manner described herein.

The load lock chamber 20 includes a sealing surface 26 that is located in the process chamber 12 and a load lock cover 24 for access into the load lock chamber 20. The sealing surface 26 is configured such that when the sampling receiving stage 28 is in the sample introduction position, one or more portions of the sample receiving stage 28 are in contact with the sealing surface 26 of the load lock chamber 20 providing a sealed barrier between the inner volume of the process chamber 12 and the interior of the load lock chamber 20. In one embodiment, a mechanism 31 is used to force contact between the sample receiving stage 28 and the sealing surface 26 of the load lock chamber 20 to form such a sealed barrier.

The sample positioning apparatus 30, which may also be referred to as the manipulator in one or more embodiments, may include any components necessary to move the associated sample receiving stage 28 from the introduction position forming a sealed barrier between the process chamber 12 and the load lock chamber 20 and the processing position in the process chamber 12 at which processing (e.g., analysis) of the sample 11 is performed. In FIG. 3, the introduction position is shown by the solid line sample receiving stage 28 being in forced contact with the load lock chamber 20 to form the sealed barrier. The solid line sample 11 is positioned within the interior of the load lock chamber 20 in this introduction position. The processing position (e.g., analysis position) is shown in FIG. 3 by the dashed line sample receiving stage 28' being positioned proximate one or more processing system components 38 such that dashed line sample 11' is positioned for processing (e.g., analysis) thereof.

In one or more embodiments, the sample positioning apparatus 30 is moveable, at a minimum, along two axes. For example, as shown in FIG. 3, movement along one axis 36 is used to move the sample 11 between the processing position and the introduction position (e.g., load lock position), while movement along another of the axis 32 is used to engage the sample receiving stage 28 with the sealing surface 26 of the load lock chamber 20 to form the sealed barrier. Movement along axis 36 may be referred to in one or more embodiments as horizontal travel, whereas movement along axis 32 may be described in one or more embodiments as vertical travel. It will be recognized that travel along the vertical axis may also be used to provide for vertical travel as shown by arrow 34 to provide for locating the receiving stage 28' at the processing position, as well as for providing vertical travel at the introduction position.

One will recognize that the sample positioning apparatus 30 may provide for movement along additional axes 35, as desired. For example, one or more additional axes 35 may be required for fine positioning of the sample at either the introduction and/or processing positions.

The sample positioning apparatus 30 may include any type of drive apparatus suitable for moving the sample receiving stage 28 from the introduction position to the processing position and/or providing engagement to form the sealed barrier at the introduction position between the process chamber 12 and the load lock chamber 20. For example, an electric motor may provide for movement of one or more components of the sample positioning apparatus 30, a hydraulic system may provide for such movement and/or travel along one or more of the axes, a pneumatic system may be used to provide for such movement, or any other suitable drive components may be used as well.

The sealed barrier between the process chamber 12 and the load lock chamber 20 may be provided in one or more various manners using one or more various components. In other words, any manner of providing a sealed relationship between the sample receiving stage 28 and the sealing surface 26 of the load lock chamber 20 may be used to provide the sealed barrier between the process chamber 12 and the load lock chamber 20.

In one embodiment, a sealing component 33 is provided to assist in providing the sealed barrier between the process chamber 12 and the load lock chamber 20. For example, the sealing component 33 may be attached or otherwise provided or associated with the sample receiving stage 28, or may be associated with the load lock chamber 20 as part of the sealing surface 26. For example, the sealing component may include any suitable element for providing such a sealed barrier when sample receiving stage 28 is forced into contact with sealing surface 26 associated with the load lock chamber 20. For example, such a sealing component 33 may include an elastomer o-ring, a metal o-ring, a metal K-seal, a spring energized PTFE component, or any other suitable sealing material, such as a compressible material useable to provide a sealed relationship between surfaces.

In one or more embodiments, a seal compression mechanism 31 is used to provide a force to assist in forming the sealed relationship between the sample receiving stage 28 and the sealing surface 26 of the load lock chamber 20 located in the process chamber 12. The seal compression mechanism 31 may include any component configured to force contact between the sample receiving stage 28 and the sealing surface 26 of the load lock chamber 20 (e.g., to provide force to compress sealing component 33). Further, the seal compression mechanism 31 provides the force necessary to work against load lock pressure within the load lock chamber 20 so as to increase the pressure therein for equalization to that of the process chamber 12. Such a compression force may be provided by the sample positioning apparatus 30, such as by movement of one or more components in a vertical direction providing a force against the sealing surface 26 of the load lock chamber 20. However, the compression force may be provided by any other external device, apart from the sample positioning apparatus 30. For example, any additional component, such as pneumatically driven or hydraulically driven components, may be used to provide such a compression force.

The load lock chamber 20 includes a removable seal cover 24 that can be removed for access to the sample 11 so as to allow positioning of the sample 11 within the load lock chamber 20. Yet further, the load lock chamber 20 includes any suitable porting to allow for pressurization or evacuation of the load lock chamber when the sample receiving stage 28 is in the introduction position providing the sealed barrier between the process chamber 12 and the load lock chamber 20. Such a sealed barrier is accomplished, at least in part, due to the provision of a sealing surface 26 of the load lock chamber 20 inside the process chamber 12, such that upon forced contact by the sample receiving stage 28 with the sealing surface 26, the sealed barrier is provided between the introduction volume in the interior of the load lock chamber 20 and the interior volume 12 of the process chamber 12.

The process chamber 12 may be formed of any type of material suitable for processing of the sample. The process chamber 12 may include any suitable porting and associated pumping apparatus necessary for pressurization or evacuation of the process chamber 12 such that the internal environment of the chamber 12 can be below atmospheric pressure and/or above atmospheric pressure.

The sample receiving stage 28 associated with the sample positioning apparatus 30 may include one or more various components. The sample receiving stage 28 may be a separate component connected to the sample positioning apparatus, or may be integrally formed as part of the sample positioning apparatus 30 which is moved from the introduction position to the processing position within the process chamber 12. The sample receiving stage 28 may include a platform or a platform surface upon which a sample is provided such that the platform provides a sealed barrier between the interior of the load lock chamber 20 and the interior of the process chamber 12. Such a platform may be provided as an integral part of the sample receiving stage 28 and/or may be provided as a separate component thereof.

One will recognize that any configuration of a sample receiving stage 28 associated with the sample positioning apparatus 30 is contemplated in accordance with the present invention. The sample receiving stage 28 (e.g., a load lock sealing plate or platform) need only be configured to provide for the sealed barrier relationship between the load lock chamber 20 and the process chamber 12 and capable of receiving a sample 11 either indirectly or directly thereon. For example, the sample receiving stage 28 may include one or more other components, plates, stages, which may be provided on the sample receiving stage 28 to receive the sample 11. In other words, the sample 11 need not be directly positioned on the sample receiving stage 28, but one or more other components may be used to receive the sample 11. In such a manner, the sample receiving stage can be modified to provide the capabilities for customized analytical or other processing experiments or techniques.

With use of the sample receiving stage 28 for mounting the sample to be processed (e.g., analyzed), larger samples can be manipulated relative to those samples manipulated in conventional transfer systems. This is primarily due to the use of the sample receiving stage 28 being moved by the sample positioning apparatus 30 into the processing position as opposed to a transfer device being used in a conventional system to move the sample, as shown and described in the Background of the Invention section herein.

The one or more process system components 38 may include any suitable components configured to process sample 11' in the processing position (e.g., obtain information from sample 11' located in the analysis position). Such process system components 38 may include components used for performing various processes including analytical processes. For example, such components may include process tools for use in performing various deposition processes (e.g., atomic layer deposition (ALD), high density plasma-chemical vapor deposition (HDP-CVD), low pressure-chemical vapor deposition (LPCVD), plasma enhanced chemical vapor deposition (PECVD), and sub-atmospheric pressure chemical vapor deposition (SACVD)), etching processes, molecular beam epitaxy (MBE), ion implantation processes, decoupled plasma nitridation (DPN), and annealing processes (e.g., rapid thermal processing (RTP)). Yet further, for example, such process system components may include components of any analysis systems or instruments that may be configured with the process chamber to obtain measurements from the sample 11'. For example, the components may be components used in instruments such as scanning electron microscopes (SEMs), instruments for performing elipsometry, instruments for performing transmission electron microscopy (TEM), instruments for performing scanning transmission electron microscopy (STEM), instruments for performing secondary ion mass spectrometry (SIMS), instruments for performing x-ray photoelectron spectrometry (XPS, also known as electron spectroscopy for chemical analysis (ESCA)), instruments for performing auger electron spectrometry (AES), electron energy loss spectrometry (EELS), low energy electron diffraction (LEED), sputtered neutral mass spectrometry (SNMS), or any other instruments for use in measuring of one or more properties of a sample (e.g., instruments using electron beams, etc.). The present invention is not limited to any particular system components (e.g., analysis components) as any one of a variety of instruments may be configured to be used in combination with introduction and process system as described therein.

One or more optional components 29 may also be provided as part of the introduction and process system 10. For example, one or more heating or cooling elements 37 to provide for heating or cooling of the sample may be utilized. Such heating or cooling elements 37 may be provided as a part of the sample receiving stage or one or more other components described herein of the introduction and process system 10. By virtue of the sample receiving stage 28 associated with the sample positioning apparatus 30 being used both at the introduction position and processing position, common hardware to provide such auxiliary functions can easily be provided.

In one or more embodiments, the introduction and process system 10 provides for the introduction and transfer of samples (e.g., solid analytical samples) from a higher pressure environment to a lower pressure environment. The introduction apparatus serves as the sample manipulator used to position the samples for analysis by an instrument designed to take measurements from the sample surface.

Further, in one or more embodiments, the sample receiving stage 28 (e.g., the load lock sealing platform) to which the samples may be directly or indirectly mounted provides a sealed barrier between the high and low pressure areas in the load lock chamber. This relieves the requirement to have a separate valve between high and low pressure areas as is used in conventional systems.

Yet further, for example, samples may be mounted directly to the mechanism employed for positioning (e.g., the manipulator). This permits the mounting of samples more rigidly, more accurately, and with higher repeatability. It also allows the sample mounting system to be reconfigured to accommodate a wide variety of sample shapes without breaking volume of the process chamber. Further, it also eliminates the need for a method to correlate position coordinate systems from any external positioning apparatus that may be employed and the precision pointing mechanism inside the vacuum of the process chamber.

Still further, the sample positioning apparatus performs the functions of the sample delivery from the loading or introduction position to the processing position (e.g., analysis position). A separate delivery mechanism is therefore not required as is utilized in conventional systems. In other words, one existing axes of a conventional manipulator is extended to perform this additional functionality of the present invention. In other words, a sample manipulator that may be used in conventional transfer systems is provided with extended travel capability to move between processing and introduction positions.

In one or more embodiments of the introduction and process system 10, one or more auxiliary components may be used to provide for the loading of sample 11 into load lock chamber 20. For example, a transfer type sample mounting system 13 can be employed which will allow the removal of samples for in-vacuum storage or for transfer to an auxiliary chamber 17 for processing. For example, the load lock chamber 20 may be associated with one or more other process chambers of a cluster-type system, wherein one or more of the auxiliary chambers 17 may be a storage chamber; another process chamber; another introduction and process system, such as the system shown generally in FIG. 3; or any other auxiliary component where the sample is not to be exposed to atmospheric or other undesirable conditions.

FIG. 4 shows one embodiment of a generalized loading and processing method 50 according to the present invention that may be implemented using the introduction and process system 10, such as that shown in FIG. 3. For example, at ambient conditions (e.g., atmospheric pressure), sample 11 is provided on sample receiving stage 28 associated with sample positioning apparatus 30. The sample positioning apparatus 30 is used to move the sample 11 from an introduction position or loading position to a processing position (block 52). The environment within the load lock chamber 20 is equalized with the environment in the process chamber 12, and the sample positioning apparatus 30 moves the sample receiving stage 28, including the sample 11, to the processing position (block 54).

With the sample 11 in the processing position, processing (e.g., analysis) is performed on the sample (block 56). In other words, processing is performed on the sample 11 with the sample 11 on the sample receiving stage 28 associated with the sample positioning apparatus 30; the same sample receiving stage 28 that is used to provide an isolated load lock chamber 20 when the environment within the load lock chamber 20 is matched to the environment in the process chamber 12.

After completion of processing (e.g., analysis), the sample positioning apparatus 30 moves the sample receiving stage 28, including sample 11, from the processing position to the sample introduction or loading position (block 58). With the sample receiving stage in the introduction or loading position such that the sealed barrier exists between the interior of the process chamber 12 and the interior of the load lock chamber 20, the load lock environment is brought to ambient conditions (e.g., atmospheric pressure) and the sample 11 is removed (block 60). A new sample may be provided (block 62) and the method 50 repeated for the new sample.

One will recognize that various other process steps may be included in this general method 50 and that, for example, more than one type of processing may be performed on the sample. For example, the process chamber 12 may be evacuated or pressurized, the load lock chamber 20 may be evacuated or pressurized to match the environment within the interior of the process chamber 12, an auxiliary seal plate may be used to seal off the load lock chamber when the sample 11 is provided in the processing position, and/or one or more other functionalities may be provided in one or more process steps by one or more components of an introduction and process system, as described herein (e.g., sample heating and cooling may be provided, sample receiving stage 28 may be modified to accept different types of samples, etc.).

Figure 6C:
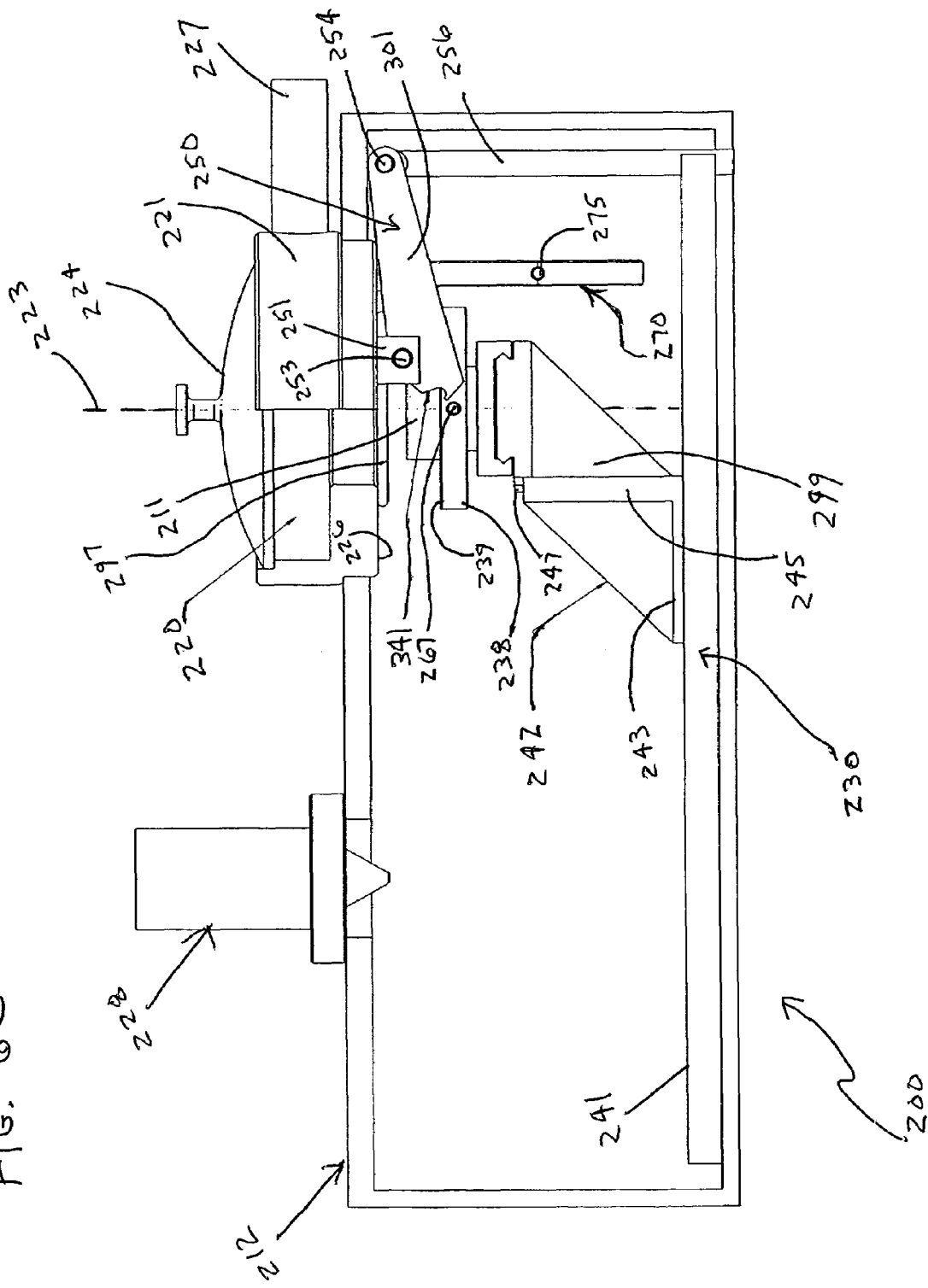
FIG. 6C shows a detailed side view (i.e., with a chamber side removed) of one embodiment of an introduction and process system shown in FIG. 6A with the sample to be processed (e.g., analyzed) being released from the introduction position.

FIG. 5 shows a more detailed block diagram of one embodiment of the loading and processing method 50 shown generally in FIG. 4. The loading and processing method 100 shown in the block diagram of FIG. 5 may be implemented using an illustrative introduction and process system 200 illustrated in FIGS. 6A-6D. FIG. 6A shows a detailed side view (i.e., with a chamber side removed) of the introduction and process system 200 with a sample 211 to be processed in an introduction position (e.g., load lock position). FIG. 6B is a cut-away and partial perspective view of the introduction and process system 200 shown in FIG. 6A with the sample to be processed in the introduction position. FIG. 6C shows a detailed side view (i.e., with a chamber side removed) of the introduction and process system shown in FIG. 6A with the sample 211 to be processed being released from the introduction position and FIG. 6D is yet another side view (i.e., with a chamber side removed) of the introduction and process system 200 with the sample 211 being located in a processing position and an auxiliary seal plate 270 being used to seal the load lock chamber 220 as described herein.

As shown in FIGS. 6A-6D, collectively referred to herein as FIG. 6, the introduction and process system 200 includes a process chamber 212 configured to provide either a vacuum or pressure environment (e.g., using a suitable port and pumping apparatus) (not shown). The process chamber 212 generally includes an introduction region 215 associated with the introduction of a sample into the process chamber 212 and a processing region 213 wherein a sample is processed (e.g., analyzed) using one or more process system components 228.

The introduction and process system 200 further includes a load lock chamber 220 associated with the process chamber 212 proximate the introduction region 215 thereof. The load lock chamber 220 includes a generally cylindrical body member 221 extending along axis 223 having a load lock cover 224 that is removably sealed to a first end 291 of the body member 221. A sealing surface 226 is defined at the second end 293 of the cylindrical body member 221 extending along axis 223. The body member 221 is generally open into the process chamber 212 at introduction region 215 thereof with the sealing surface 226 positioned within the process chamber interior (e.g., flush with a wall of the chamber 212 and/or extending into the interior of the process chamber 212). One or more other components, as described herein, are forced into contact with the sealing surface 226 so as to provide a sealed load lock chamber 220 (e.g., sample receiving stage 238). The load lock chamber 220 further includes a pumping port 227 for use with associated pumping equipment (not shown) for use in matching the environment of the load lock chamber 220 to that of the process chamber 212, or some other desired environment, either by evacuation or pressurization.

Further, as shown in FIG. 6, introduction and process system 200 includes a sample positioning apparatus 230 for moving sample receiving stage 238 into sealed engagement with sealing surface 226 of load lock chamber 220 for providing a barrier between the interior of the process chamber 212 and the interior of the load lock chamber 220. Further, sample positioning apparatus 230 provides for movement of the sample receiving stage 238 between the introduction position (e.g., when the sealed barrier is formed between the process chamber 212 and the load lock chamber 220) and the processing position in the processing region 213 of the process chamber 212 (e.g., when the sample 211 is positioned on the sample receiving stage 238 and may be processed such as with use of one or more analysis system components 228).

The sample receiving stage 238 includes a sealing surface 239 for use in providing a sealed barrier when forced in contact with sealing surface 226 of load lock chamber 220. A sealing component 297 (e.g., an o-ring, either metal or elastic) may be used as part of either sealing surface to establish a sealed relationship between the sealing surface 226 and sealing surface 239. It will be recognized that the sealing component may be associated with either of such surfaces, and when such sealing surfaces are mentioned herein, it is meant that either one or both of the surfaces may include such a sealing component 297 which is considered to be included as part of the sealing surface.

The sample positioning apparatus 230, as best shown in FIG. 6B, although the other figures are also useful in illustrating its structure, includes a base 241 which extends along a length of the process chamber 212 from the introduction region 215 to the processing region 213 thereof. The base 241 includes a plurality of tracks 287 in which a horizontal traveling member 243 of a manipulator 242 is received. The manipulator 242, with use of one or more drive apparatus (e.g., electric motor, hydraulic, pneumatic, or any other suitable drive) (not shown), allows the manipulator 242 associated with the sample receiving stage 238 to be horizontally transported between the introduction region 215 and the processing region 213 within the process chamber 212.

The manipulator 242 further comprises a vertical base member 245 extending orthogonally from the horizontal traveling member 243. The orthogonally extending base member 245 extending from the horizontal traveling member 243 includes a plurality of tracks 285 for receiving a vertical traveling member 247 therein. The vertical traveling member 247 includes a lower portion (not shown) that is continually within tracks 285 and an upper structure 283. The vertical traveling member 247 supports the sample receiving stage 238 (e.g., using support structure 299 extending from the vertical traveling member and upon which the sample receiving stage 238 is received or otherwise connected thereto).

The vertical traveling member 247 is operatively connected to drive apparatus (e.g., electric, pneumatic, hydraulic, or any other suitable drive) (not shown) so as to provide vertical movement of the sample receiving stage 238 into position for contact between the sealing surface 239 (e.g., an upper surface of the sample receiving stage 238) and load lock sealing surface 226 at the second end 293 of the load lock chamber when the manipulator 242 is in the introduction region 215. When the manipulator 242 is in the processing region 213, the vertical traveling member 247 is used to position the sample receiving stage 238 and a sample 211 provided thereon in proximity to one or more process system components 228 for processing of the sample 211 (e.g., analysis of the sample).

Further, the introduction and process system 200 includes a seal compression mechanism 250 for providing a force to compress the seal 297 and to provide a force to work against pressurization in load lock chamber 220. In one embodiment, as shown in FIG. 6, the seal compression mechanism 250 includes elongated element 301 extending between a first end 302 and a second end 303. The elongated element 301 is hinged at pivot point 253 to a tab structure 251 connected (e.g., directly or indirectly) to cylindrical body 221 of load lock chamber 220. An engagement surface 341 is provided at the first end 302 of the elongated element 301 and the second end 303 of elongated element 301 is pivotally attached at pivot point 254 to a force producing member 256.

One will recognize that this same structure is provided on the other side of the load lock chamber 220 with another elongated member (not shown) being similarly attached. Force producer 256 provides a force (e.g., in the direction as indicated by arrow 321) to both of such elements so as to engage engaging surfaces (e.g., engaging surface 341 and the one on the opposite side of the load lock chamber 220) with engagement elements (e.g., engagement element 267 and the one on the opposite side of the sample receiving stage 238) extending outward from sample receiving stage 238. Upon application of the force 321 by the force producer 256 (e.g., any drive apparatus capable of providing such a force, whether pneumatic or hydraulic or electrically driven), the engagement surfaces (e.g., engaging surface 341 and the one on the opposite side of the load lock chamber 220) with engagement elements (e.g., engagement element 267 and the one on the opposite side of the sample receiving stage 238) so as to provide compression of seal component 297. As such, a sealed barrier can be provided between the load lock chamber 220 as formed with the sample receiving stage 238 in an introduction position and the interior volume of the process chamber 212.

Yet further, the introduction and process system 200 may include an auxiliary seal plate 270 that is configured in a similar manner to that of sample receiving stage 238. As shown in FIG. 6D, the auxiliary seal plate 270 is pivotally mounted at pivot axis 272 such that as manipulator 242 moves sample receiving stage 238 associated therewith in the introduction region 215 to the processing position in processing region 213, the auxiliary seal plate 270 (e.g., the auxiliary seal plate 270 being normally in a retracted position) is moved into engagement with sealing surface 226 of the load lock chamber 220. The auxiliary seal plate 270 is generally of the same configuration as the sample receiving stage 238 and includes engagement elements 275 extending therefrom. As such, seal compression mechanism 250 may be used to provide a force on the auxiliary seal plate 270 necessary to compress the seal 297 and form a sealed barrier between the load lock chamber 220 and the process chamber 212 when the manipulator 242 has moved the sample receiving stage 238 into a processing position.

One will recognize that the auxiliary seal plate 270 is in a retracted position when the sample receiving stage 238 is providing a sealed barrier between the process chamber 212 and the load lock chamber 220. Any mechanism (e.g., a cam mechanism associated with manipulator 242, seal compression mechanism 250, or any other components of the system, or otherwise provided separately therefrom) may be used to move the auxiliary seal plate 270 into position adjacent sealing surface 226 of load lock chamber 220. For example, in one embodiment as shown in FIG. 6D, the auxiliary seal plate 270 may be biased in the position to provide a sealed barrier between the process chamber 212 and load lock chamber 220 and retraction thereof may be activated by motion of the manipulator 242. However, such retraction may be activated by any separate device, as well. The auxiliary seal plate 270 is particularly beneficial with ultra-high vacuum systems so as to minimize contamination in the process chamber 212 from the load lock chamber 220.

In the loading and processing method 100 shown in the flow diagram of FIG. 5, with the load lock chamber 220 at ambient conditions (e.g., atmospheric pressure), a sample 211 is provided on a sample receiving stage 238 (e.g., a sealing platform having one or more receiving elements or surfaces for receiving samples to be processed) (block 110). For example, with the sample receiving stage 238 in the introduction position to isolate the load lock chamber 220 from the process chamber 212, load lock cover 224 may be removed and the sample positioned therein. In other words, with the cover 224 removed, the receiving stage 238 is accessible in the load lock chamber 220. Modifications may be made to the receiving stage 238 (e.g., sealing platform) to be able to accommodate a variety of different types of samples.

With the sample positioned, the load lock chamber 220 may be closed by replacing and sealing load lock cover 224 in position relative to load lock cylindrical body 221, and the conditions in the load lock chamber 220 may be modified (e.g., load lock chamber may be evacuated or pressurized using pumping port 227) (block 112). Such placement of the sample 211 in the load lock chamber 220 is shown in FIG. 6A and also in FIG. 6B with the receiving stage 238 in the introduction position.

The manipulator 242 may then move the sample receiving stage 238 (e.g., sealing platform) so as to position the sample 211 in the processing position (block 114). For example, as shown in FIG. 6C, the force producer 256 releases its force on the sample receiving stage 238 disengaging the engagement surfaces (e.g., surface 341) from the engagement elements (e.g., element 267). The vertical traveling member 247 is then moved away (e.g., down) from the load lock chamber 220 and horizontal traveling member 243 of the manipulator 242 moves the sample receiving stage 238 into the processing region 213 of the process chamber 212 as shown in FIG. 6D. The vertical traveling member 247 may then be used to raise the sample receiving stage 238 into a position as desired for processing (e.g., analysis) of the sample 211 by the one or more process system components 228. In one embodiment, optionally, the auxiliary seal plate 270 is moved into position to seal the load lock chamber 220 from the process chamber 212 when the sample 211 is in the processing position (block 116).

With the sample 211 in the processing position, the sample is processed (e.g., analyzed using one or more analysis system components 228) (block 118). Thereafter, the manipulator 242 is then used again to move the sample receiving stage 238 to the sample introduction position in the introduction region 215 of the process chamber 212 in such a manner as described herein to isolate the load lock chamber 220 from the process chamber 212 (block 120). If the optional auxiliary seal plate 270 is used, it is retracted prior to the sample receiving stage 238 being moved into the introduction or loading position.

With the sealed barrier between the process chamber 212 and the load lock chamber 220, the load lock may be brought to ambient conditions (e.g., to atmospheric pressure). The load lock chamber 220 may be opened by removing the removable sealing cover 224, and the sample 211 may be removed (block 122). A new sample may be provided into the load lock chamber 220 and the method repeated (block 124). In addition, the sample receiving stage 238 may be modified to receive a substantially different sample than the previous sample introduced and processed, and the process may be repeated.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative embodiments may be provided which utilize various combinations of the elements described herein. Various modifications of the illustrative embodiments, as well as additional embodiments of the invention and combinations of various elements herein, will be apparent to persons skilled in the art upon reference to this description. It is therefore contemplated that the patented claims will cover any such modifications or embodiments that may fall within the scope of the present invention as defined by the accompanying claims.

What is claimed is:

1. A method for processing a sample, the method comprising:
   providing a process chamber associated with a load lock chamber;
   providing a sample receiving stage coupled to a sample positioning apparatus, wherein the sample positioning apparatus is configured to move the sample receiving stage between an introduction position and a processing position within the process chamber;
   moving the sample receiving stage using the sample positioning apparatus to the introduction position resulting in a sealed barrier between the process chamber and the associated load lock chamber;
   positioning a sample on the sample receiving stage;
   moving the sample receiving stage using the sample positioning apparatus to the processing position, wherein moving the sample receiving stage using the sample positioning apparatus to the processing position comprises moving the sample receiving stage along a plurality of axes from a region of the process chamber proximate the load lock chamber to a region of the process chamber proximate at least one component of a processing system associated with the process chamber, wherein moving the sample receiving stage along the plurality of axes comprises:
      moving the sample receiving stage along a first axis providing for horizontal travel,
      moving the sample receiving stage along a second axis providing for vertical travel, and moving the sample receiving stage along one or more additional axes to provide fine positioning of the sample receiving stage with the sample thereon in the region of the process chamber proximate at least one component of the processing system associated with the process chamber; and processing the sample positioned on the sample receiving stage.

2. The method of claim 1, wherein the processing system associated with the process chamber comprises an instrument configured to take measurements from the sample.

3. The method of claim 1, wherein the method further comprises:

providing one or more heating or cooling elements associated with the sample receiving stage; and using the one or more heating or cooling elements to heat or cool the sample receiving stage, respectively, at both the introduction position and at the processing position.

4. The method of claim 1, wherein moving the sample receiving stage using the sample positioning apparatus to the introduction position comprises:

moving the sample receiving stage using the sample positioning apparatus from the processing position to the introduction position after processing the sample resulting in the sealed barrier between the process chamber and the associated load lock chamber;

returning the load lock chamber to ambient conditions;

opening the load lock chamber; and removing the sample from the sample receiving stage to allow for another sample to be positioned on the sample receiving stage.

5. The method of claim 1, wherein positioning the sample on the sample receiving stage comprises:

opening the load lock chamber to allow access thereto;

providing the sample on the receiving stage;

closing the load lock chamber; and modifying ambient conditions in the load lock chamber.

6. The method of claim 1, wherein moving the sample receiving stage using the sample positioning apparatus to the introduction position resulting in the sealed barrier between the process chamber and the associated load lock chamber comprises moving the sample receiving stage at least along a second axis to force contact between the sample receiving stage and a sealing surface of the load lock chamber located in the process chamber.

7. A method for processing a sample, the method comprising:

providing a process chamber associated with a load lock chamber;

providing a sample receiving stage coupled to a sample positioning apparatus, wherein the sample positioning apparatus is configured to move the sample receiving stage between an introduction position and a processing position within the process chamber;

moving the sample receiving stage using the sample positioning apparatus to the introduction position resulting in a sealed barrier between the process chamber and the associated load lock chamber;

positioning a sample on the sample receiving stage;

moving the sample receiving stage using the sample positioning apparatus to the processing position, wherein moving the sample receiving stage using the sample positioning apparatus to the processing position comprises positioning an auxiliary seal mechanism to provide another sealed barrier between the process chamber and the associated load lock chamber when the sample receiving stage is moved to the processing position; and processing the sample positioned on the sample receiving stage.

8. The method of claim 7, wherein positioning the auxiliary seal mechanism to provide another sealed barrier between the process chamber and the associated load lock chamber comprises positioning an auxiliary seal plate to provide the another sealed barrier between the process chamber and the associated load lock chamber, wherein positioning the auxiliary seal plate comprises using a mechanism separate from the sample positioning apparatus to move the auxiliary seal plate into position to provide the another sealed barrier between the process chamber and the associated load lock chamber.

9. A method for processing a sample, the method comprising:

providing a process chamber associated with a load lock chamber;

providing a sample receiving stage coupled to a sample positioning apparatus, wherein the sample positioning apparatus is configured to move the sample receiving stage between an introduction position and a processing position within the process chamber;

moving the sample receiving stage using the sample positioning apparatus to the introduction position resulting in a sealed barrier between the process chamber and the associated load lock chamber;

positioning a sample on the sample receiving stage, wherein positioning the sample on the sample receiving stage comprises using a transfer-type sample mounting system to transfer one or more samples between the sample receiving stage and one or more auxiliary chambers;

moving the sample receiving stage using the sample positioning apparatus to the processing position; and processing the sample positioned on the sample receiving stage.

10. A method for processing a sample, wherein the method comprises:

using a sample positioning apparatus to position a sample provided on a sample receiving stage for processing in a process chamber held at conditions different than ambient conditions;

providing a load lock chamber comprising a sealing surface, wherein the sealing surface is located within the process chamber; and moving the sample receiving stage using the sample positioning apparatus into contact with the sealing surface of the load lock chamber permitting the load lock chamber to be returned to ambient conditions, wherein using the sample positioning apparatus to position a sample provided on the sample receiving stage for processing in a process chamber comprises moving the sample receiving stage along a plurality of axes from a region of the process chamber proximate the load lock chamber to a region of the process chamber proximate at least one component of a processing system associated with the process chamber, wherein moving the sample receiving stage along the plurality of axes comprises:

moving the sample receiving stage along a first axis providing for horizontal travel, moving the sample receiving stage along a second axis providing for vertical travel, and moving the sample receiving stage along one or more additional axes to provide fine positioning of the sample receiving stage with the sample provided thereon in the region of the process chamber proximate at least one component of the processing system associated with the process chamber.

11. The method of claim 10, wherein the processing system associated with the process chamber comprises an instrument configured to take measurements from the sample.

12. The method of claim 10, wherein the method further comprises:
providing one or more heating or cooling elements associated with the sample receiving stage; and
using the one or more heating or cooling elements to heat or cool the sample receiving stage, respectively, when the sample receiving stage is in position for processing in the process chamber and also when the sample receiving stage is in contact with the sealing surface of the load lock chamber.

13. The method of claim 10, wherein the method further comprises:
returning the load lock chamber to the ambient conditions after the sample receiving stage is moved into contact with the sealing surface of the load lock chamber;
opening the load lock chamber; and
removing the sample from the sample receiving stage to allow for another sample to be positioned on the sample receiving stage.

14. The method of claim 13, wherein the method further comprises:
providing the sample on the receiving stage;
closing the load lock chamber; and
evacuating or pressurizing the load lock chamber.

15. A method for processing a sample, wherein the method comprises:
using a sample positioning apparatus to position a sample provided on a sample receiving stage for processing in a process chamber held at conditions different than ambient conditions;
providing a load lock chamber comprising a sealing surface, wherein the sealing surface is located within the process chamber; and
moving the sample receiving stage using the sample positioning apparatus into contact with the sealing surface of the load lock chamber permitting the load lock chamber to be returned to ambient conditions, wherein the method further comprises positioning an auxiliary seal mechanism to provide a sealed barrier between the process chamber and the associated load lock chamber when the sample receiving stage is positioned for processing the sample.

16. The method of claim 15, wherein positioning the auxiliary seal mechanism to provide a sealed barrier between the process chamber and the associated load lock chamber comprises positioning an auxiliary seal plate to provide the another sealed barrier between the process chamber and the associated load lock chamber, wherein positioning the auxiliary seal plate comprises using a mechanism separate from the sample positioning apparatus to move the auxiliary seal plate into position to provide the sealed barrier between the process chamber and the associated load lock chamber.

17. A method for processing a sample, wherein the method comprises:
using a sample positioning apparatus to position a sample provided on a sample receiving stage for processing in a process chamber held at conditions different than ambient conditions;
providing a load lock chamber comprising a sealing surface, wherein the sealing surface is located within the process chamber; and
moving the sample receiving stage using the sample positioning apparatus into contact with the sealing surface of the load lock chamber permitting the load lock chamber to be returned to ambient conditions, wherein the method further comprises using a transfer-type sample mounting system to transfer one or more samples between the sample receiving stage and one or more auxiliary chambers.

18. A system for use in processing a sample, wherein the system comprises:
a process chamber configured to be held at conditions different than ambient conditions;
a load lock chamber comprising a sealing surface located within the process chamber;
a sample receiving stage for receiving a sample; and
a sample positioning apparatus associated with the sample receiving stage, wherein the sample positioning apparatus is configured to move the sample receiving stage between an introduction position at which the sample receiving stage is in contact with the sealing surface of the load lock chamber providing a sealed barrier between the process chamber and the load lock chamber and a processing position in the process chamber at which processing of the sample is performed, and further wherein the sample positioning apparatus is configured to move the sample receiving stage along a first axis providing for horizontal travel, along a second axis providing for vertical travel, and along one or more additional axes to provide fine positioning of the sample receiving stage with the sample thereon in a region of the process chamber proximate at least one component of a processing system associated with the process chamber used for processing the sample at the processing position.

19. The system of claim 18, wherein the load lock chamber is associated with a port for pressurization or evacuation of the load lock chamber.

20. The system of claim 18, wherein the load lock chamber comprises a removable sealed cover for access to an interior of the load lock chamber.

21. The system of claim 18, wherein the sample positioning apparatus comprises a manipulator mechanism configured to move the sample receiving stage to force contact between the sample receiving stage and the sealing surface of the load lock chamber.

22. The system of claim 18, wherein the processing system associated with the process chamber comprises an instrument configured to take measurements from the sample.

23. The system of claim 18, wherein the system further comprises one or more heating or cooling elements associated with the sample receiving stage to heat or cool the sample receiving stage, respectively, when the sample receiving stage is in both the introduction position and the processing position.

24. A system for use in processing a sample, wherein the system comprises:
a process chamber configured to be held at conditions different than ambient conditions;
a load lock chamber comprising a sealing surface located within the process chamber;
a sample receiving stage for receiving a sample; and
a sample positioning apparatus associated with the sample receiving stage, wherein the sample positioning apparatus is configured to move the sample receiving stage between an introduction position at which the sample receiving stage is in contact with the sealing surface of the load lock chamber providing a sealed barrier between the process chamber and the load lock chamber and a processing position in the process chamber at which processing of the sample is performed, wherein the system further comprises an auxiliary sealing plate configured to be moved into contact with the sealing surface of the load lock chamber when the sample receiving stage is moved to the processing position.

25. The system of claim 24, wherein the auxiliary seal plate is positionable using a mechanism separate from the sample positioning apparatus to provide a sealed barrier between the process chamber and the associated load lock chamber.

26. A system for use in processing a sample, wherein the system comprises:
- a process chamber configured to be held at conditions different than ambient conditions;
- a load lock chamber comprising a sealing surface located within the process chamber;
- a sample receiving stage for receiving a sample; and
- a sample positioning apparatus associated with the sample receiving stage, wherein the sample positioning apparatus is configured to move the sample receiving stage between an introduction position at which the sample receiving stage is in contact with the sealing surface of the load lock chamber providing a sealed barrier between the process chamber and the load lock chamber and a processing position in the process chamber at which processing of the sample is performed, wherein the system further comprises a transfer-type sample mounting system to transfer one or more samples between the sample receiving stage and one or more auxiliary chambers.

* * * * *